United States Patent [19]

Ikeda

[11] 3,987,435
[45] Oct. 19, 1976

[54] ANALOG-TO-DIGITAL CONVERTER UTILIZING TIME REFERENCE FOR EFFECTING CONVERSION

[75] Inventor: Masayuki Ikeda, Suwa, Japan

[73] Assignee: Kabushiki Kaisha Suwa Seikosha, Tokyo, Japan

[22] Filed: Nov. 27, 1974

[21] Appl. No.: 527,717

[30] Foreign Application Priority Data
Nov. 28, 1973 Japan.............................. 48-133185
Dec. 10, 1973 Japan.............................. 48-137544

[52] U.S. Cl.......................... 340/347 NT; 324/99 D
[51] Int. Cl.²........................................ H03K 13/02
[58] Field of Search............... 340/347 NT, 347 AD; 324/99 D; 235/92 CA

[56] References Cited
UNITED STATES PATENTS

| | | | |
|---|---|---|---|
| 3,316,547 | 4/1967 | Ammann...................... | 340/347 NT |
| 3,500,384 | 3/1970 | Naydan et al. ............... | 340/347 NT |
| 3,665,457 | 5/1972 | Wheable...................... | 340/347 NT |
| 3,777,828 | 12/1973 | Dietemeyer.................. | 340/347 NT |
| 3,878,370 | 4/1975 | Santomangs et al. .......... | 235/92 CA |

*Primary Examiner*—Thomas J. Sloyan
*Attorney, Agent, or Firm*—Blum, Moscovitz, Friedman & Kaplan

[57] ABSTRACT

An analog-to-digital converter adapted to utilize a counting circuit including a quartz crystal vibrator time standard as the time reference for effecting analog-to-digital conversion. The converter includes oscillator means for producing a time standard signal, and counter means including a plurality of series-connected divider stages adapted to produce timing signals representative of the counts thereof in response to the time standard signal. Coincidence circuitry is coupled to a first plurality of the divider stages to produce a signal in response to the coincidence of the count of the first plurality of counters and a preselected count of the coincidence circuit. Control means produce first and second control signals in response to the coincidence signal from the coincidence circuit and the timing signals from the remaining divider stages in the counter circuit. Voltage supply circuitry is coupled to the control circuitry in order to apply an analog voltage in response to a first control signal, and in response to a second control signal from said control means, apply a reference voltage of a polarity opposite to the analog voltage to integrate the analog voltage applied thereto, and thereby effect an integration of the reference voltage of opposite polarity applied thereto, to thereby sum both voltages to zero. Digital processing circuitry is coupled to said integrator circuit and the first plurality of divider stages, and in response to detecting the integrator circuit summing to zero, processes to elapsed time required for the reference voltage to be summed to zero counted by the first plurality of divider stages, the elapsed time digitally representing the analog voltage applied to the integrator circuit.

9 Claims, 6 Drawing Figures

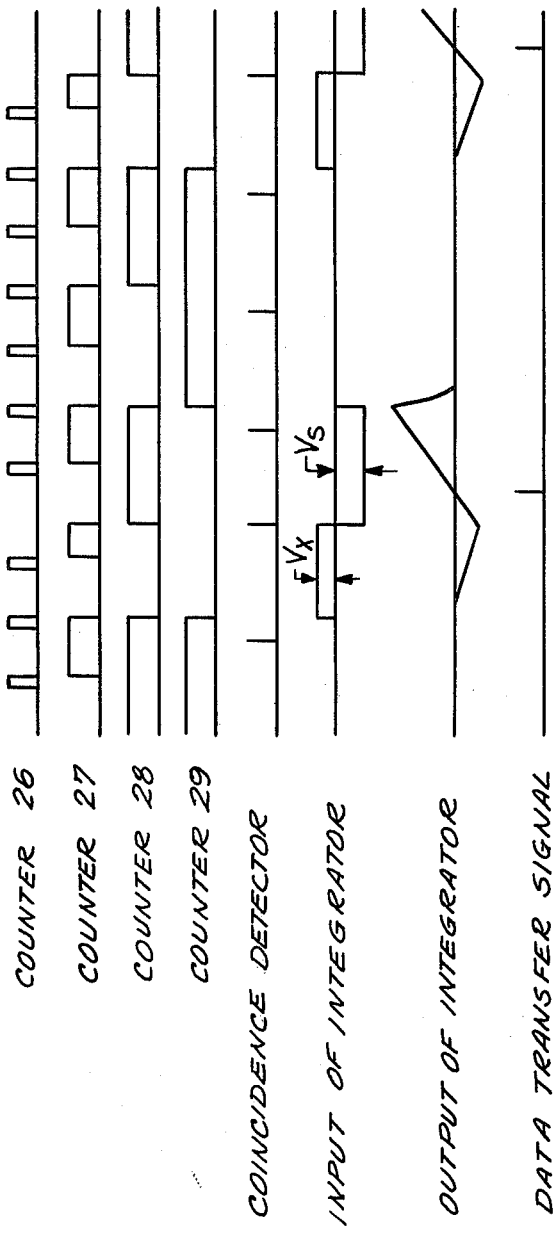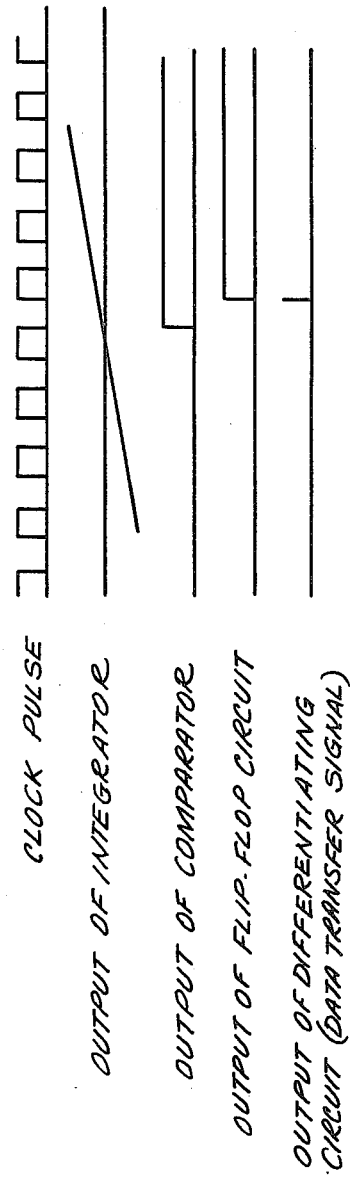
FIG. 3a
FIG. 3b

ANALOG-TO-DIGITAL CONVERTER UTILIZING TIME REFERENCE FOR EFFECTING CONVERSION

BACKGROUND OF THE INVENTION

This invention is directed to an analog-to-digital converter, and in particular to an analog-to-digital converter wherein the converter is synchronized with the timing of the counter circuit, the counter circuit utilizing a quartz crystal vibrator or other like time standard as a time base for effecting conversion.

Heretofore, analog-to-digital converters including counter circuits for producing a digital signal in response to an analog voltage thereto, have utilized a gating circuit between the oscillator circuit and the counter circuit for starting and terminating the count of the counter. The gating circuit is usually controlled by an integrator circuit adapted to sum an analog voltage, and a reference voltage of an opposite polarity to the analog voltage, and in response to summing same to zero, the gating circuit terminates the count of the counter to produce a digital representation of the analog signal. Such analog-to-digital converters are less than completely satisfactory in view of the use of the signal from the integrator circuit as a gating signal. Such use of the integrated signal as a gating signal and a quartz crystal vibrator as a time standard causes the presence of AC noise voltages superposed upon the analog voltage to be substantially unavoidable.

In the art, it is recognized that the time over which a voltage to be converted is integrated must be set at "N" times the frequency of the superposed noise signal (where "N" is an integer). By adjusting the oscillating frequency of the oscillator circuit such setting is achieved over a wide range of frequencies. Accordingly, the oscillator circuit must be one which is stable over a wide range of frequencies thereby eliminating the use of inexpensive quartz crystal vibrators of the type which are mass produced and utilized in color televisions, quartz crystal timepieces, etc. Instead, oscillator circuits having adjusting capacitors of considerably large range are required to effect the adjustment over the range of frequencies necessary thereby increasing the cost of such analog-to-digital converters even when integrated circuit techniques are utilized to fabricate same. An digital-to-digital converter, wherein mass-produced quartz crystal vibrators can be utilized, and wherein AC noise signals superposed upon the analog signal are substantially eliminated is provided in accordance with the instant invention.

SUMMARY OF THE INVENTION

Generally speaking, in accordance with the invention, an analog-to-digital converter is provided wherein conversion is synchronized with the output of a counter circuit and the gating circuit is provided. The analog-to-digital converter includes an oscillator circuit for producing a time standard signal, and a counter circuit including a plurality of series connected divider stages adapted to produce timing signals representative of the count thereof in response to said time standard signal. Coincidence circuitry is coupled to a first plurality of said divider stages for producing a signal in response to the coincidence in the count of the first plurality of divider stages and a preselected count of the coincidence circuit. A control circuit produces first and second control signals in response to the coincidence signal from the coincidence circuit and control signals from the remaining divider stages in the counter circuit. A voltage supply circuit is coupled to the control means and is adapted to supply an analog voltage in response to a first control signal and a reference voltage of a polarity opposite to the analog voltage in response to the second control signal. An integrator circuit is coupled to the voltage supply circuit for integrating the analog voltage applied thereto, and further integrating the reference voltage of opposite polarity to sum both voltages applied thereto. A processing circuit is coupled to the integrator circuit and in response to the integrator circuit summing to zero is adapted to read the elapsed time counted by the first divider stage that the integrator circuit requires to sum the reference voltage to zero, the elapsed time read by the processing circuit digitally representing the analog voltage.

Accordingly, it is an object of this invention to provide an improved analog-to-digital converter wherein AC noise signals in the analog voltage are reduced to a minimum.

Another object of this invention is to provide an improved analog-to-digital converter wherein counters utilized to produce a time reference standard are always coupled to the oscillator circuit producing a time standard.

Still another object of this invention is to provide an improved analog-to-digital converter wherein the converter is capable of multiplying the analog signal applied thereto.

Still a further object of this invention is to provide an improved analog-to-digital converter wherein the integration time is more accurately determined by a quartz crystal vibrator having a narrow tuning range.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 3a and 3b are timing diagrams representing the operation of the analog-to-digital converter circuit depicted in FIG. 2;

DETAILED DESCRIPTION OF THE PREFERRED EMBODIMENTS

Figure 1:
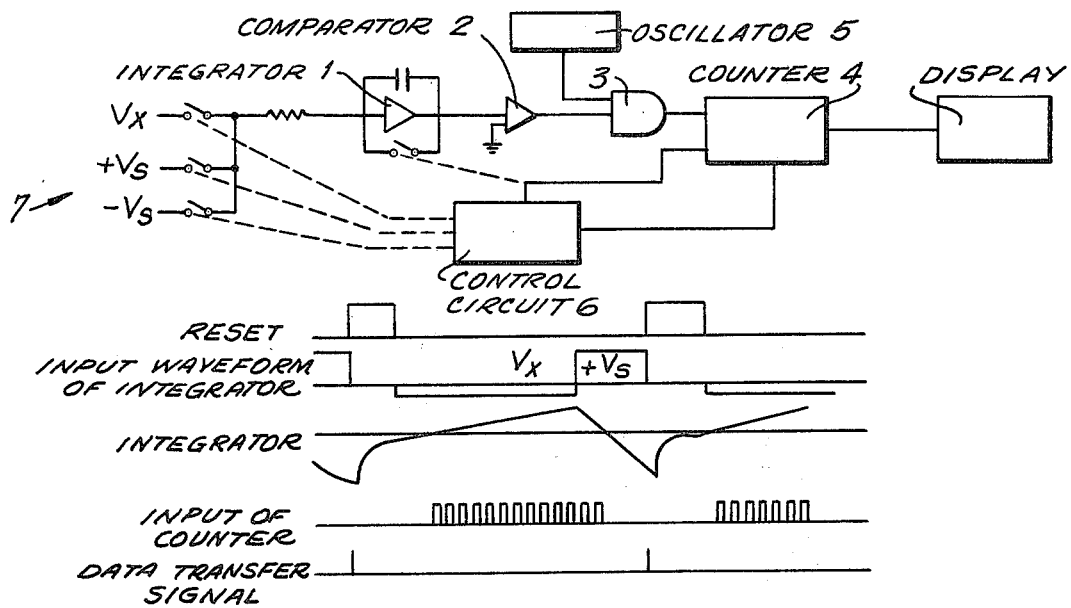
FIG. 1 is a block circuit diagram of an analog-to-digital converter constructed in accordance with the prior art.
Figure 2:
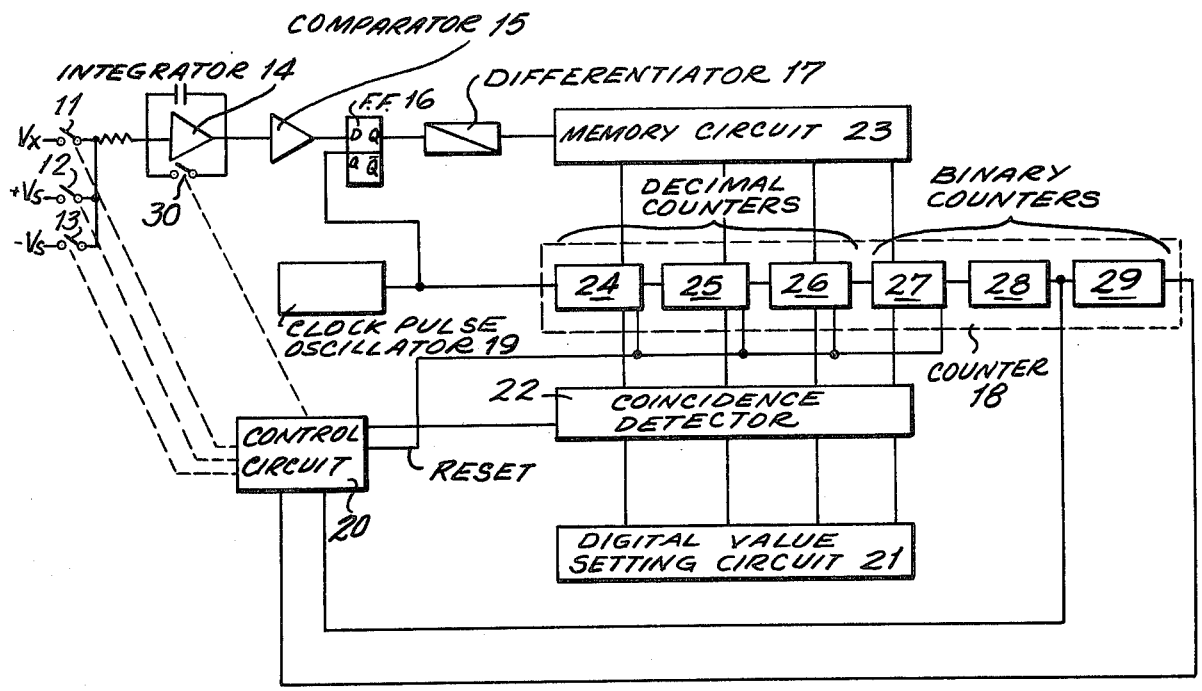
FIG. 2 is a block circuit diagram of an analog-to-digital converter constructed in accordance with the instant invention.

Reference is now made to FIGS. 1 and 2 wherein a dual-slope integration type analog-to-digital converter and wave diagrams therefor are depicted. The analogto-digital converter, hereinafter referred to in the application as A–D converter, includes an integrator circuit 1 adapted to receive a first analog voltage $V_x$ and reference voltages $+V_s$ and $-V_s$ and in response thereto integrate same. A comparator 2 is adapted to detect the output level of the integrator and in response thereto apply a gating signal to AND gate 3. Oscillator circuit 5 applies a time standard signal through AND gate 3 to counter 4 in response to a gating signal produced by comparator 2. A display is coupled to counter 4 and is adapted to display the numbers counted thereby. Control circuit 6 is adapted, in response to a signal from counter 4 to effect a selection of one of the analog or reference voltages and a resetting of the integrator circuit, as well as a reading by the display of the number counted by the counter 4 in the following manner.

First, a reset signal resets the counter 4 and integrator circuit 1. Thereafter, the analog voltage $V_x$ is applied, by a closing of the switch associated therewith, to the integrator 1. When the amplitude of the signal integrated by integrator circuit 1 increases above a reference voltage level, it is detected by comparator 2 and causes a positive or one signal to be applied to AND gate 3 to effect a gating of the signals produced by the oscillator circuit 5 to counter 4. At a preselected period of time thereafter, a reference voltage of a polarity opposite to the analog voltage is applied to the integrator circuit, the integrator circuit summing the difference between the two voltages until the level of the signal integrated returns to the above-noted reference level, whereupon transmission of the pulses produced by the oscillator to the counter 4 through gate 3 is terminated. The digital representation of the analog voltage is then displayed in response to a data transfer signal applied to counter 4 coincident with the application of a reset signal to integrator circuit 1 and counter 4 to reset same to zero to once again effect an analog-to-digital conversion.

Accordingly, in such A-D circuits the following relationship exists:

$$T_x = \frac{\overline{V_x}}{V_s} T_s \quad (1)$$

where $$\overline{V_x} = \frac{1}{T_x} \int_0^{T_x} V_x dx \quad (2)$$

wherein $V_x$ is the analog voltage to be converted, $T_x$ is the time over which the converted voltage $V_x$ is integrated once the same reaches reference voltage level, $V_s$ is the reference voltage, and $T_s$ is the time over which the reference voltage $V_s$ is integrated until same reaches the initial reference level. Accordingly, when AC noise voltages are superposed upon $V_x$, the noise influences can only be ignored or disregarded if $T_x$ is set to be N times the frequency of the noise voltage, (where N equals an integer).

In order to disregard the AC noise voltages in conventional dual-slope A–D converters, the time over which the converted voltage is integrated, $T_x$, is selected to be N times longer than the frequency of the superposed AC noise voltages by adjusting the oscillating frequency of the oscillator circuit 5. Heretofore, conventional A–D converters have utilized commercial power sources for their time standard, and accordingly, the time over which the analog voltage to be converted was uniform because same was based on the frequency of the commercial power source. However, A–D converters driven by batteries and therefore not utilizing commercial power sources, have not been able satisfactorily to achieve stable oscillation. In order to obtain such stable oscillation when a battery is utilized as the power source, a quartz crystal oscillator circuit is required. Nevertheless, the oscillating frequency of a circuit utilizing a quartz crystal vibrator must be selected in order to advance the time characteristic over which the circuit is integrated to thereby eliminate the superposed AC noise signal. Because the oscillator frequency must be varied over a wide range of frequencies, mass produced low priced quartz crystal vibrators of the type utilized in color televisions, quartz crystal wristwatches and the like cannot be utilized in the conventional A-D converters. Furthermore, because the control circuit effects application of the analog voltage and reference voltages independent of the timing of the oscillator, the lowest digit of the converted digital value displayed flickers, providing a less than pleasing result to the user. Additionally, in order to tune the oscillator circuit, very large capacitors having a large range must be utilized and, if, in addition, a liquid crystal display is utilized, an additional oscillator must be utilized to drive the liquid crystal display. Thus, in conventional A-D converters, many capacitors must be attached from the outside to effect tuning. Because the capacitors cannot be avoided, the capacitors raise an impediment to the integration of the circuit in a single chip, and hence increase the costs of manaufacturing of an integrated circuit A–D converter.

Reference is now made to FIGS. 2, 3a and 3b, wherein an A–D converter, and the timing signals for same, constructed in accordance with the instant invention, are depicted. The A–D converter includes switches 11, 12 and 13 controlled by control circuit 20 to respectively select the analog voltage $V_x$, or a reference voltage + or $-V_s$ by the selective actuation of switches 11, 12 and 13 by control circuit 20. The switches 11, 12 and 13 couple the analog voltage and reference voltages to integrator circuit 14 which circuit includes a reset switch 30 selectively actuated by control circuit 20 to effect resetting of the integrator circuit in response thereto. Integrator circuit 14 is coupled to a comparator 15 and in response to a signal above a reference voltage, the comparator applies an input to the D terminal of flip-flop 16 which includes as its other input a high frequency time standard clock pulse produced by clock pulse oscillator 19. In response to the coincident application of a pulse from comparator 15 and clock pulse oscillator 19, differentiator circuit 17 applies a data transfer signal to a memory circuit 23 to effect a reading operation thereby. Reference is made to FIG. 3b, wherein the manner in which the data transfer signal to be applied to the memory circuit 23 is produced in response to the integrator circuit 14 is shown. In response to the output of the integrator reaching a reference voltage, when same effects summing to zero in a manner to be discussed below, the comparator provides a pulse to flip-flop 16. Flip-flop 16, in response to a positive clock pulse from clock pulse oscillator 19, applies an output to differentiator 17, which produces a data transfer signal to be applied to the memory circuit 23.

Clock pulse oscillator 19 is also directly coupled to counter circuit 18 which includes series connected decimal counters 24, 25 and 26, and binary counters 27, 28 and 29. The decimal counters 24, 25 and 26 and binary counter 27, the upper stage of the binary counters, are utilized as the counter circuit for producing signals representative of the analog-to-digital conversion. Accordingly, the maximum number that the analog signal can be converted to is 1,999. Additionally, the lower two stages 28 and 29 of the binary counters are utilized to apply control signals to control circuit 20 to effect selective application of the analog voltage and the reference voltages and setting of integrator circuit 30.

The A–D converter additionally includes memory circuit 23 coupled to the output of decimal counters 24, 25 and 26 and binary counter 27, to thereby read in the count thereof in response to a data transfer signal applied thereto in the manner indicated above. Finally, a digital value setting circuit 21 is provided for allowing the digital value to be remotely selected by an operator. A coincidence detector 22, in response to the decimal counters 24, 25 and 26 and binary counter 27 producing the number selected digital value by the digital value setting circuit 21, applies a coincidence detection signal to control circuit 20 to further effect control of the analog voltage selecting switch 11 and reference voltage switches 12 and 13.

It is noted that for purposes of explanation, clock pulse oscillator 19 is selected to produce a time standard signal having a frequency of 16,384 Hz. Accordingly a quartz crystal vibrator of the type utilized to electronic wristwatches is utilized in the clock pulse oscillator circuit to produce the time standard signal clock pulses. However, it is noted that the invention is not limited to a frequency of 16,384 Hz or the use of three decimal counters and one binary counter to effect a maximum count of 1,999, since same have been selected by way of example and are not intended to define the scope of applicant's invention.

Conversion from an analog signal to a digital representation therefor is commenced by a selective closing of switch 30 by control circuit 20, coincident with the closing of switch 11 to apply the analog voltage $V_x$ to integrator circuit 14. As is explained in further detail below, the count of counter 18 is set to zero coincident with the closing of switches 30 and 11 to thereby commence the operation of the circuit. Also, the digital value setting circuit 21 is set to a predetermined value N, (where N is less than or equal to 1,999).

Referring specifically to FIG. 3a, analog voltage $V_x$ is applied to integrator circuit 14 until such time as coincidence detector 22 detects coincidence between the preselected number N of the digital value setting circuit 21 and the count of counters 24 to 27, and in response theeto, applies a coincidence detection signal to control circuit 20. Control circuit 20 in response to the coincidence detection signal applies a reset signal to counters 24 through 27 thereby resetting same to zero, the convention of the counters being selected so that setting to zero effects an indexing of the next series connected counterstage. Accordingly counters 24 through 27 are reset to zero, and counter 28 is indexed by one thereby supplying a signal to control circuit 20 to effect opening of switch 11 and the closing of one of switches 12 and 13 depending on the polarity of the analog voltage to be converted. If the analog voltage to be converted is of a positive polarity, with respect to the reference voltage then negative reference voltage $-V_s$ is selected. Accordingly it is necessary to select a reference voltage of a polarity opposite to the polarity of the analog voltage to be converted. Since the analog voltage $V_x$ indicated in FIG. 3a is positive, a reference voltage of $-V_s$ is selected by selective actuation of switch 13 and coincident with the resetting of counters 24 through 27, the reference voltage is applied to integrator circuit 14. Integrator circuit 14 sums the negative and positive voltages and at a time when the voltages are summed to the reference voltage or zero, actuates comparator 15 in the manner discussed above to thereby apply a data transfer signal to the memory circuit 23. Accordingly, the memory circuit 23 reads the value counted by the counters 24 through 27 in response to the data transfer signal, the number read therein being a digital representation of the analog voltage converted. The counters continue to count until they reach the upper limit 1,999, whereupon divider stage 29 is indexed and applies a control pulse to control circuit 20 to once again effect selective actuation of switch 11 and switch 30 at the same instant that the counters have a zero count to thereby commence another conversion operation. Thus the digital data read into the memory circuit can be decoded and displayed. It is noted that the control circuit 20 is not limited to integrating the analog voltage at the time that the data in the counter is reset to zero but can be reset at any count, the only requirement being the adjustment of the control circuit to a selected number.

It is further noted, that AC noise voltages are generally in a frequency range of 50 to 60 Hz when commercial line supply voltages are utilized. In accordance with the instant invention, the superposed AC noise voltage can be eliminated by multiplying same by an integral thereof. Thus multiplication of the signal by multiples of 100 msec. will achieve such an effect. If the full count or upper limit of the counter is 1,999, and the quartz crystal vibrator is selected at an oscillating frequency of 16,380 Hz., if the analog voltage to be converted is integrated from the time the counter is reset until the full count, the integrating time will be approximately 122.1 msec. Consequently, the highly desirable characteristic of eliminating the superposed noise voltages cannot be obtained. Nevertheless, if the digital value setting circuit 21 is set at the number N equal to 1,638, the time over which the integrator circuit is integrating to convert the voltage is approximately 99.98 msec and the ratio of eliminating the superposed noise voltages is 0.02% (−74dB). Thus, the effects of the superposed AC noise voltages for all intents and purposes are eliminated.

Additionally, because the A–D converter is completely synchronized with the control circuit, there is no flickering of the converted value of the lowest digit produced by the decimal counter as occurs in the conventional converter circuits wherein a first oscillator circuit produces clock pulses and a second oscillator is required for operating the driving circuit. Additionally, because the counter is always being indexed by the clock pulse oscillator 19 in view of the elimination of the gate circuit required in the prior art converter circuit, the alternating current voltage can be utilized for driving a liquid crystal and the clock pulse can additionally be used to multiplex any of the signals from the divider stage to effect driving of the liquid crystals. Moreover, the digital representation of the analog voltage can be selected to any proportion by setting a specific digital value rendering it possible to effect multiplication between the analog voltage to be converted and the digital quantity N selected. Moreover, the reference level can be changed in accordance with the digital value setting circuit and the high ratio of superposed noise voltage is eliminated by adjusting the digital value and reference level.

Figure 4:
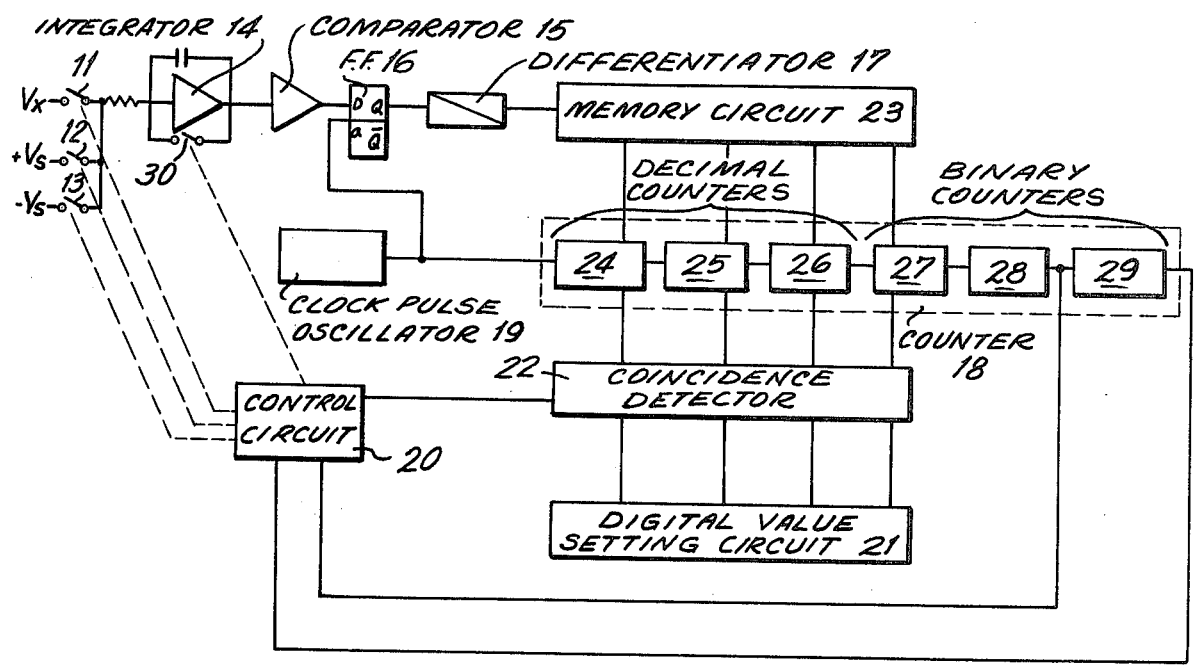
FIG. 4 is a block circuit diagram of an analog-to-digital converter constructed in accordance with an alternate embodiment of the instant invention.
Figure 5:
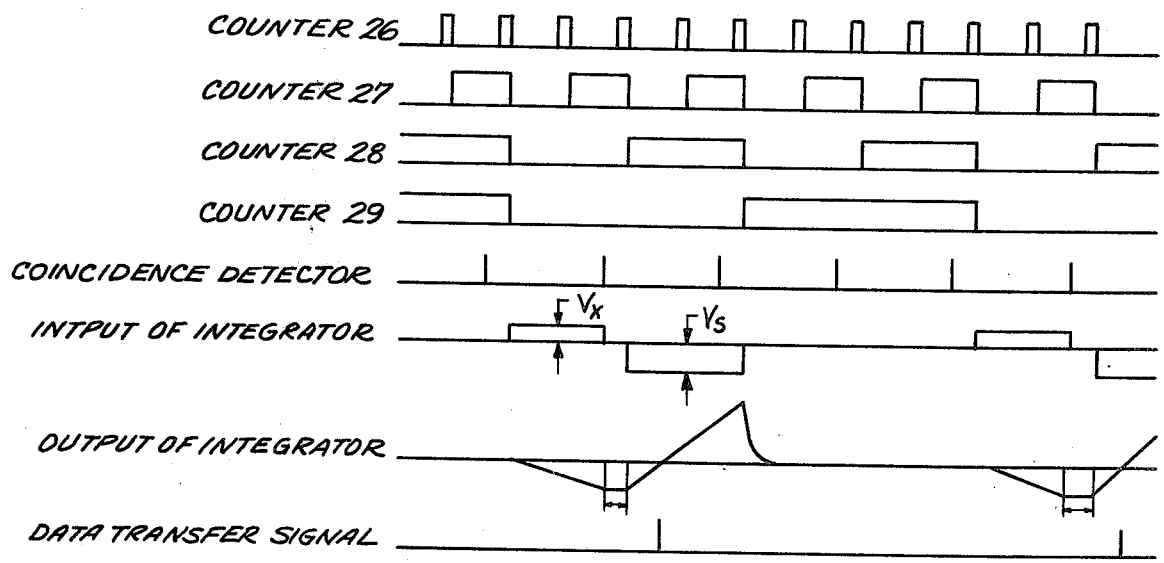
FIG. 5 is a timing diagram representing the operation of the analog-to-digital converter illustrated in FIG. 4.

Reference is now made to FIGS. 4 and 5 wherein an A–D converter constructed in accordance with an alternate embodiment of the instant invention is depicted, like reference numerals being utilized to denote like elements. As is specifically illustrated in FIG. 5, instead of utilizing a reset voltage t9 reset the count of counters 24 through 27 to zero coincident with the coincidence detection signal being applied to control circuit 20, as discussed above in the converter illustrated in FIG. 2, the control circuit 20 can effect an opening of switch 11 to thereby terminate the application of the analog voltage to the integrator circuit in response to the coincidence detection signal. Upon counting up to the upper limit by counters 24 through 27, binary counter 28 applies a control signal to control circuit 20 which effects application of the reference voltage to the integrator circuit 14 at the moment that the count of the counters 24 through 27 is returned to zero. The operation of the embodiment of FIG. 4 is in every other detail the same as described with respect to the embodiment illustrated in FIG. 2.

It is noted that in accordance with the embodiment discussed above, the integration time of the analog voltage to be converted can be adjusted in a suitable manner, thus making such a converter particularly adapted for use with a quartz crystal vibrator of the type utilized in electronic timepieces. Moreover, the count of the counter is directly coupled to a quartz crystal oscillator circuit, and the different voltages required for operating control circuit 20 can be obtained from the counter to thereby render unnecessary the need for additional oscillators in the converter. This makes the integration of the entire circuitry of the converter circuit, without the necessity of including capacitors of high capacitance, far more simple. Moreover, because the control circuit is in synchronism with counter 18, stabilized conversion even at the lowest digit of the analog-to-digital converter value is achievable even when driven by a battery thereby rendering a stable time base easy to achieve.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims aare intended to cover all of the generic and specific features of the invention herein described, and all statements of the scope of the invention, which, as a matter of language, might be said to fall therebetween.

What is claimed is:

1. In an analog-to-digital converter having oscillator means for producing a time standard signal, and counter means incuding a plurality of series connected divider stage means adapted to produce timing signals representative of the count thereof in response to said time standard signal, the improvement comprising: coincidence means coupled to a first plurality of said divider stage means for producing a coincidence signal in response to the coincidence in the count of the first plurality of divider stages and a preselected count of said coincidence means; control means for seriatim producing first and second control signals in response to the timing signals produced by the remaining divider stage means in said counter means, said control means also producing a third control signal in response to said coincidence signal being applied thereto; voltage supply means coupled to said control means for respectively producing one of an analog voltage in response to said first control signal being applied thereto and a reference voltage of a polarity opposite to said analog voltage in response to said second control signal being applied thereto, said voltage supply means in response to said third control signal being applied thereto terminating the producing of said analog signal; integrator means coupled to said voltage supply means for seriatim integrating said analog voltage and said reference voltage of opposite polarity produced by said voltage supply means to thereby sum both voltages received thereby and in response to summing said voltages to zero producing a data transfer signal; and digital processing means coupled to said first plurality of divider stage means, and in response to said data transfer signal being applied thereto processing the elapsed time counted by the first plurality of divider stage means, the elapsed time digitally representing the analog voltage applied to the integrator circuit whereby the elapsed time over which the voltage is converted is selectable to be N times larger than the frequency of any superposed noise voltage.

2. An analog-to-digital converter as claimed in claim 1 wherein said control means in response to said coincidence signal applies said second signal to said voltage supply means to effect an application of said reference voltage of a polarity opposite to the analog voltage to the integrator circuit, and resets the count of the first plurality of divider stage means.

3. An analog-to-digital converter as claimed in claim 1 wherein said coincidence means includes digital value setting means for determining a time reference over which said analog voltage is integrated by setting same to a preselected count, and a coincident detector for sensing the coincidence between the time counted by the first plurality of divider stage means and the digital value setting means, and in response thereto applying a coincidence signal to said control means.

4. An analog-to-digital converter as claimed in claim 3 wherein said control means in response to the coincident application of said second control signal and said coincidence signal effects an application of said reference voltage of a polarity opposite to the analog voltage to the integrator circuit, and resets the count of the first plurality of divider stage means.

5. An analog-to-digital converter as claimed in claim 3, wherein said voltage supply means includes at least three switch means coupled to said control means, said first switch means being actuated by said first control signal produced by said control means to effect application of said analog voltage to the integrator means, one of said second and third switches being actuated by said second control signal produced by said control means to effect application of said reference voltage of a polarity opposite to the analog voltage to said integrator means.

6. An analog-to-digital converter as claimed in claim 5, wherein said integrator means includes a reset means coupled to said control means to effect resetting of said integrator means in response to said first control signal produced by said control means.

7. An analog-to-digital converter as claimed in claim 3, wherein said digital processing means includes memory means for storing the time counted by the first plurality of divider stage means required for the reference voltage to effect summing of the integrator circuit to zero, in response to said data transfer signal.

8. An analog-to-digital converter as claimed in claim 7, wherein said integrator means includes an integrator circuit coupled to said voltage supply means, a comparator coupled to said integrator circuit for comparing signals integrated thereby, said comparator in response to a summing to zero supplying a signal representative thereof, a flip-flop adapted to receive said comparison signal as a first input, and said time standard signal as a second input, and in response to said time standard signal and comparator signal, produce a flip-flop pulse, and differentiator means adapted to receive said flip-flop pulse and in response thereto produce said data transfer signal.

9. An analog-to-digital converter as claimed in claim 3, wherein the preselected count of said digital value setting means is adapted to be remotely set.

* * * * *